(12) United States Patent
Jetton et al.

(10) Patent No.: US 7,746,716 B2
(45) Date of Patent: Jun. 29, 2010

(54) MEMORY HAVING A DUMMY BITLINE FOR TIMING CONTROL

(75) Inventors: Mark W. Jetton, Austin, TX (US); Lawrence F. Childs, Austin, TX (US); Olga R. Lu, Austin, TX (US); Glenn E. Starnes, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 93 days.

(21) Appl. No.: 11/677,808

(22) Filed: Feb. 22, 2007

(65) Prior Publication Data

US 2008/0205176 A1 Aug. 28, 2008

(51) Int. Cl.
G11C 7/00 (2006.01)
G11C 7/02 (2006.01)
G11C 8/00 (2006.01)

(52) U.S. Cl. .............................. 365/210.1; 365/210.15; 365/230.3; 365/233.1; 365/205; 365/207; 365/208

(58) Field of Classification Search .................. 365/194, 365/189.09, 189.11, 203, 210.1, 230.03, 365/210.15, 233.1, 205, 207, 208
See application file for complete search history.

(56) References Cited

U.S. PATENT DOCUMENTS

| | | | |
|---|---|---|---|
| 5,058,062 A | 10/1991 | Wada et al. | |
| 5,329,176 A | 7/1994 | Miller, Jr. et al. | |
| 5,357,480 A | 10/1994 | Vinal | |
| 5,388,075 A | 2/1995 | Vinal | |
| 5,619,464 A | 4/1997 | Tran | |
| 5,999,482 A | 12/1999 | Kornachuk et al. | |
| 6,061,293 A | 5/2000 | Miller et al. | |
| 6,181,626 B1 * | 1/2001 | Brown | 365/210.1 |
| 6,275,070 B1 | 8/2001 | Pantelakis et al. | |
| 6,282,131 B1 | 8/2001 | Roy | |

(Continued)

FOREIGN PATENT DOCUMENTS

KR  10-1995-0009878 B1  9/1995

OTHER PUBLICATIONS

Chen et al., Patent Application Publication US 2008/0037338 A1 (U.S. Appl. No. 11/614,828).*

(Continued)

Primary Examiner—Trong Phan
(74) Attorney, Agent, or Firm—Susan C. Hill; Ranjeev Singh

(57) ABSTRACT

A memory having at least one memory array block, the at least one memory array block comprising N wordlines, wherein N is greater than one, is provided. The memory comprises a plurality of sense amplifiers coupled to the at least one memory array block. The memory further comprises at least one dummy bitline, wherein the at least one dummy bitline comprises M dummy bitcells, wherein M is equal to N. The memory further comprises a timing circuit coupled to the at least one dummy bitline, wherein the timing circuit comprises at least one stack of pull-down transistors coupled to a sense circuit for generating a latch control output signal used for timing control of memory accesses. Timing control may include generating a sense trigger signal to enable the plurality of sense amplifiers for read operations and/or generating a local reset signal for terminating memory accesses, such as disabling the plurality of write drivers for write operations.

20 Claims, 3 Drawing Sheets

U.S. PATENT DOCUMENTS

| | | | |
|---|---|---|---|
| 6,483,754 B1 | 11/2002 | Agrawal | |
| 6,711,092 B1 | 3/2004 | Sabharwal | |
| 6,831,853 B2 * | 12/2004 | Lin et al. | 365/194 |
| 6,894,943 B2 * | 5/2005 | Suzuki et al. | 365/194 |
| 6,950,362 B2 * | 9/2005 | Kurumada et al. | 365/194 |
| 7,035,149 B2 * | 4/2006 | Shimizu | 365/210.1 |
| 7,161,855 B2 * | 1/2007 | Kodama | 365/194 |
| 7,251,179 B2 * | 7/2007 | Ohsawa | 365/194 |
| 7,355,915 B2 * | 4/2008 | Gouin et al. | 365/194 |
| 7,499,347 B2 * | 3/2009 | Chen et al. | 365/194 |
| 2002/0145932 A1 | 10/2002 | Nguyen et al. | |
| 2002/0186579 A1 | 12/2002 | Yokozeki | |
| 2003/0099128 A1 | 5/2003 | Peterson et al. | |
| 2003/0202399 A1 | 10/2003 | Nguyen et al. | |
| 2005/0020739 A1 | 1/2005 | Dittrich et al. | |
| 2005/0104627 A1 | 5/2005 | Song | |
| 2005/0180228 A1 | 8/2005 | Canada et al. | |
| 2005/0207239 A1 | 9/2005 | Kodama | |

OTHER PUBLICATIONS

Stackhouse et al., Patent Application Publication US 2004/0257882 A1 (U.S. Appl. No. 10/600,875).*

International Search Report for coordinating PCT Application No. PCT/US08/51843 mailed Apr. 28, 2008.

Office Action mailed Jul. 9, 2008 on Related U.S. Appl. No. 11/536,136.

Notice of Allowance mailed Dec. 5, 2008 on Related U.S. Appl. No. 11/536,136.

\* cited by examiner

MEMORY HAVING A DUMMY BITLINE FOR TIMING CONTROL

CROSS-REFERENCE TO RELATED APPLICATION(S)

This application is related to U.S. patent application Ser. No. 11/536,136, filed on Sep. 28, 2006, entitled "SELF-TIMED MEMORY HAVING COMMON TIMING CONTROL CIRCUIT AND METHOD THEREFOR," having a first named inventor Glenn E. Starnes, and assigned to the current assignee hereof.

BACKGROUND

1. Field

This disclosure relates generally to memories, and more specifically, to a memory having a dummy bitline for timing control.

2. Related Art

Configurable or compiled memories allow users to specify words and bits per word within bounded ranges that result in memory configurations that span a wide range of possible physical wordline rows and bitline columns combinations and thus the physical dimensions of the instances vary significantly as well. The key to achieving maximum speed while maintaining robust operation is to be able to keep nearly constant sense margin over all possible configurations, which meets a target minimum value that ensures that data is read properly. Since process models are not exactly accurate and since the manufacturing process itself may drift or vary, it is additionally desirable to be able to adjust the sense margin if necessary without mask changes and design changes in the circuitry to be built.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
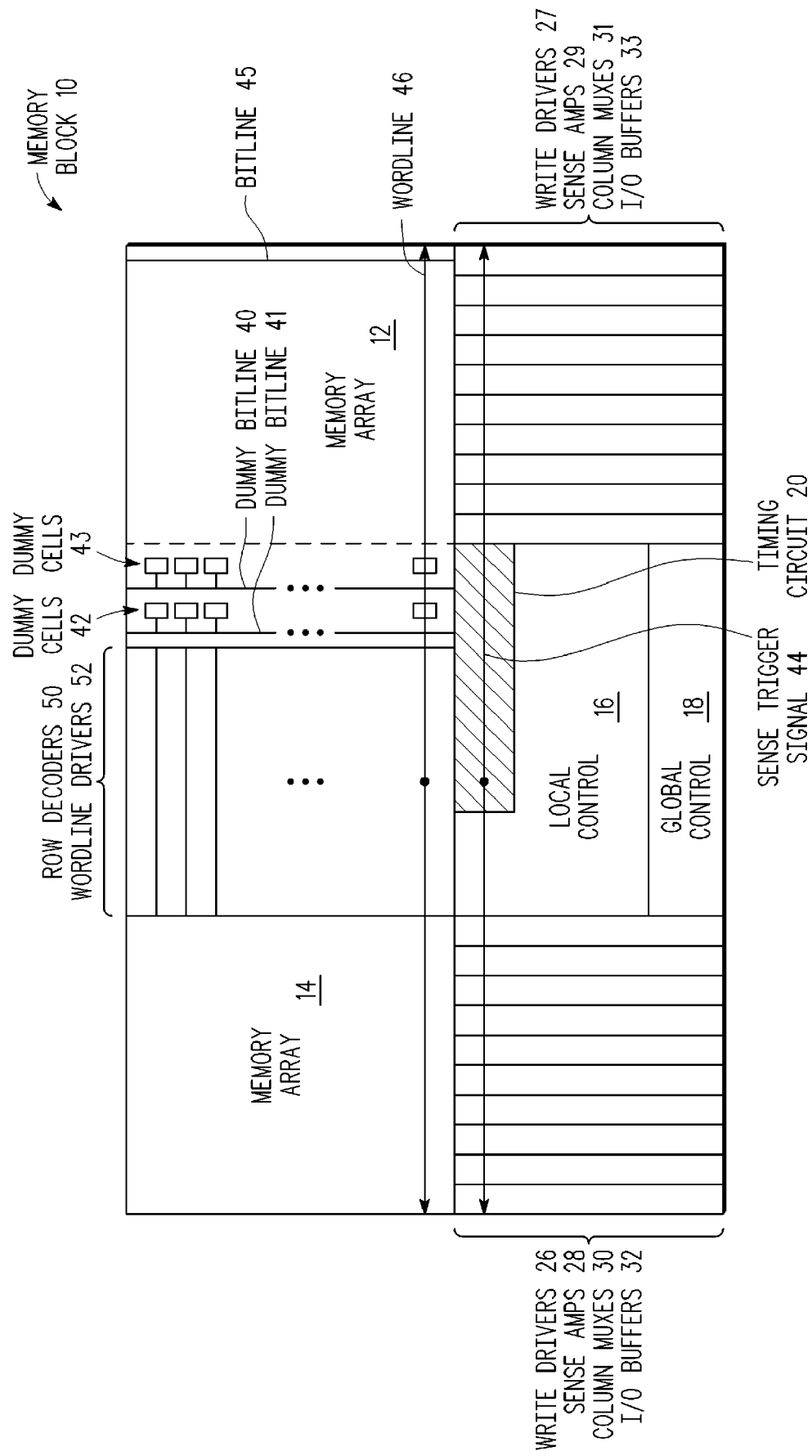
FIG. 1 illustrates, in block diagram form, a memory block 10 in accordance with one embodiment of the present invention.

Some prior art schemes use delay elements that do not track bit behavior and thus do not sufficiently track the actual behavior of a memory, especially as the dimensions of instantiations are varied. Prior art schemes that do not use dummy cells may not track sufficiently well over process variations. Some prior art schemes use complex replicas of the sense path that include dummy wordlines, dummy cells, and dummy sense amps. Unfortunately, such prior art approaches require a significant amount of semiconductor area to implement, are more difficult to adjust, and tend to be too conservative causing slowing of the memory access time. In addition, a complete replication of the sense path may not be as accurate as desired because of the wide variation in electrical characteristics of memory cells across an entire array. Because the electrical characteristics of the actual memory cells vary significantly across an array (e.g. there is a wide distribution of drive strength for cells within an array), the electrical characteristics of the dummy memory cells used for timing control can also vary significantly (e.g. the drive strength of a dummy cell can be anywhere within this wide distribution).

In one embodiment, this invention seeks to improve upon these schemes using simpler logic to provide one or more of the following, namely better tracking, more robust sensing, more optimal timing, reduced area and power, reduced timing variability across process variations, good adjustability that maintains tracking, and/or broad application to all configurable memory types, including multiblock architectures.

In one embodiment, this invention specifically addresses the need to maintain a nearly constant sense differential across compiled memory configurations to guarantee robust sensing while maximizing performance. In one embodiment, this invention uses a self-timed control circuit which uses the RC loading characteristics of one or more dummy bitlines in association with a broadly adjustable pulldown circuit that is located outside of the memory array. In one embodiment, one or more dummy bitlines within the memory array are used as loading to a discharge circuit outside the array to yield precise load matching to the normal or actual bitlines while allowing the flexibility to easily adjust the sense margin. The circuitry required may also be simpler and may also allow separate discharge control for various modes, such as, for example, read, write, and test. Alternate embodiments may include more fewer, or different modes.

Note that some embodiments of memory block 10 may use a plurality of single bitlines (i.e. a bitline signal) where the data value from a memory cell is determined by detecting a voltage on the corresponding bitline signal. Other embodiments of memory block 10 may use differential pairs of bitlines (i.e. a bitline signal and a bitline* signal) where the data value from a memory cell is determined by detecting a voltage differential on the corresponding bitline and bitline* pair. In yet other embodiments, any appropriate architecture for memory block 10 may be used.

The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterisk (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

FIG. 1 will now be described. The illustrated embodiment of memory block 10 has memory array 12 and memory array 14. In the illustrated embodiment, memory array 12 includes a plurality of actual wordlines (e.g. 46) and a plurality of actual bitlines (e.g. 45) which are coupled in the standard manner for a memory array. The remaining wordlines and bitlines are not drawn for clarity purposes. However, memory arrays 12 and 14 may have any desired number of actual wordlines (e.g. 46) and bitlines (e.g. 45). Note that memory arrays 12 and 14 share wordlines (e.g. 46), but have separate bitlines (e.g. 45). In addition, memory arrays 12 and 14 share and are coupled to local control circuitry 16 (including timing circuit 20 and sense trigger signal 44), share and are coupled to row decoders 50 and wordline drivers 52, and share and are coupled to global control circuitry 18. In the illustrated embodiment, timing circuit 20 has been cross-hatched merely for clarity purposes. Memory array 12 is coupled to write drivers 27, sense amplifiers 29, column multiplexers 31, and I/O buffers 33. Similarly, memory array 14 is coupled to write drivers 26, sense amplifiers 28, column multiplexers 30, and I/O buffers 32. In the illustrated embodiment, no dummy wordlines, dummy wordline drivers, or dummy row decoders are used. Alternate embodiments may alternately wish to use dummy wordlines, dummy wordline drivers, and/or dummy row decoders, but it is not required.

The memory block 10 illustrated in FIG. 1 does make use of dummy cells 42, 43 and dummy bitlines 40, 41. In the illustrated embodiment, a plurality of dummy memory cells or bitcells (including dummy cell 42) is coupled to dummy bitline 41, and a plurality of dummy memory cells (including dummy cell 43) is coupled to dummy bitline 40. In one embodiment, the number of dummy cells (e.g. 42) coupled to dummy bitline 41 is the same as the number of actual bit cells coupled to each corresponding actual bitline (e.g. 45) in array 12. Alternate embodiments may select the number of dummy cells (e.g. 42) coupled to a dummy bitline (e.g. 41) in another manner. Note that each wordline (e.g. 46) is used for selecting some actual cells in memory array 12 but the dummy cells' (42,43) selection gates are tied off within the dummy cells (42, 43). Note also that the wordlines' (e.g. 46) delay will vary as the width of the memory arrays (e.g. 12, 14) is increased and associated I/O circuitry (e.g. 26, 28, 30, 32, 27, 29, 31, 33) is added, but the drive strength and loading of the buffers which span this same width (e.g. buffer for the sense trigger signal 44) may be implemented in such a way as to match the wordlines' delay as it varies with memory width. Thus no dummy wordlines, dummy row decoder, or dummy wordline drivers are needed. This may save a significant amount of semiconductor area on an integrated circuit, especially when a large number of memory blocks (e.g. 10) are used. Note that in the illustrated embodiment, only one global control circuit 18 is needed, regardless of how many memory blocks (e.g. 10) are used. Memory array 14 may function in the same manner as described for memory array 12. For some embodiments, aside from the dummy cells (e.g. 42, 43), the dummy bitlines (e.g. 40, 41), the local control circuitry 16, the sense trigger signal 44, and the global control circuitry 18, the remaining circuitry of memory block 10 may function in a standard fashion, depending upon the type of memory used.

In one embodiment, the dummy bitcells are not selected by the wordlines—the pass gates are all tied off (negated) to match the loading of an unaccessed bit. In the actual array, all but one of the bits in the array column will likewise be off. The dummy bitline will still match the loading of a real bitline, including all interconnect and transistor junction capacitance, and any coupling capacitance of the active row bit on the real bitline will be negligible. Allowing the active wordline to access the dummy cell may be used in an alternate embodiment but the dummy cell, depending on its polarity, would either hinder or assist the pulldown by the pulldown circuit and potentially draw more supply current, which are all undesirable effects. Matching the dummy bitline loading to the actual bitlines may help track memory configuration variation in the Y direction. The X dimension variation is matched by approximating the same loading and cell drive that is seen by the wordline drivers for the other drivers that span the I/O area. While for some embodiments it may not be matched as precisely as the bitline loading, it may track sufficiently well with X variation to justify nonduplication of the wordline drivers in the sense timing. Note that in the illustrated embodiment, the variation in the X direction is essentially digital RC delay, whereas the variation in the Y direction deals with small-signal analog voltage differentials. As a result, for some embodiments, there is a need to more precisely match the Y dimension characteristics in the implementation of the timing circuit. In some embodiment, X-dimension matching may be achieved without the need for dummy wordlines. Alternate embodiments may function in a different manner.

In one embodiment, memory block 10 is formed on an integrated circuit. Various embodiments may have any number of memory blocks (e.g. 10). Note that various memory blocks (e.g. 10) on a single integrated circuit may have varying dimensions. In addition, memory block 10 may have any desired dimensions (i.e. may have any desired number of rows and columns). Memory 10 may be any type of memory, such as, for example, dynamic access memory (DRAM), static access memory (SRAM), various nonvolatile memories (e.g. read only memory (ROM)), register arrays, and any type of memory that can take advantage of such a method and/or structure for reducing access time and maintaining high yields.

FIG. 1 illustrates a memory block 10 having a split memory array 12 and 14. Alternate embodiments may use different architectures for memory block 10. For example, alternate embodiments may use only one memory array (e.g. 12). Yet other embodiment may use more than two memory arrays 12, 14 that use common control circuitry (e.g. 16).

In the illustrated embodiment, the length of the dummy bitlines (e.g. 40, 41) and the number of associated dummy cells (e.g. 42, 43, respectively) is increased as the number of actual rows/wordlines (e.g. 46) in memory block 10 is increased, thus duplicating the length and RC characteristics of the actual bitlines (e.g. 45). Similarly, the length of the dummy bitlines (e.g. 40, 41) and the number of associated dummy cells (e.g. 42, 43, respectively) is decreased as the number of rows/wordlines (e.g. 46) in memory block 10 is decreased, thus still duplicating the length and RC characteristics of the actual bitlines (e.g. 45). Note that in one embodiment, the number of dummy cells associated with a dummy bitline is the same as the number of actual cells associated with each actual bitline. Alternate embodiments could potentially use a different tracking ratio if desired. Thus, the RC loading characteristics of the actual bitlines (e.g. 45) may be duplicated by the dummy bitlines (e.g. 42, 43). Alternate embodiments may use any number of dummy bitlines (40, 41) in parallel to duplicate and/or multiply the loading of a single actual bitline (45) or bitline pair. Note that in this embodiment, the dummy cell logic states are configured such that they are all logic high, which will ensure maximum opposition to the pulldown circuit in the presence of bitcell pass gate leakage, thereby ensuring slower discharge and greater sense margin when leakage currents are appreciable. Thus in this embodiment, the dummy bit lines not only track the parasitic RC loading of the actual bitlines, but also comprehends the effects of maximum leakage current on the actual bitlines. The dummy cells (e.g. 42, 43) may be configured in other ways in alternate embodiments.

In some embodiments, accounting for leakage conditions may be important. As one possible example, for some circuitry and processes that use SOI (silicon on insulator) wafers, leakage may be a significant issue. Thus, for some embodiments, it may be important to comprehend and/or compensate for high leakage currents. For such embodiments, the timing circuit design may need to take into account the potentially high leakage currents. In one embodiment, the dummy bitcells may be designed (e.g. transistor sizing and layout) to provide maximum leakage current in opposition to the discharge (i.e. pulldown) circuits.

In the illustrated embodiment, the dummy cells (e.g. 42, 43) are not used to discharge their associated dummy bitlines (e.g. 40, 41, respectively). As a result, the illustrated embodiment does not required dummy wordlines and does not require dummy sense amplifiers. This can potentially result in a significant savings in area. Instead of using the dummy cells (e.g. 42, 43) to discharge their associated dummy bitlines (e.g. 40, 41, respectively), pulldown circuitry (see FIG. 2) may be used in timing circuit 20 to effect this discharge or pulldown function. By using separate pulldown circuitry instead of dummy cells (42, 43) to discharge dummy bitlines (40, 41, respectively), it is possible to use devices (e.g. transistors) whose electrical characteristics do not vary as much as bitcell devices by minimizing their sensitivity to geometrical and local (e.g. intra-die or intra-instance) process variations. For example, it may be desirable to use pulldown transistors which have one or more of the following characteristics, greater channel width, greater channel length, and/or higher threshold voltages. Alternate embodiments may choose different device characteristics that produce a pulldown effect that varies minimally across geometrical and local process variations, while maintaining desirable tracking across global process variations (e.g. die to die, wafer to wafer, and lot to lot variations). Thus, for some embodiments, the circuitry may track general process variation and trends but have some immunity against random local variations, particularly those induced by geometrical and electrical variations that typically occur with narrow width and short channel devices.

Note that in the illustrated embodiment, the function of pulling down the dummy bitlines (e.g. 40, 41) is not performed by the dummy cells (e.g. 42, 43). The problem with using the dummy cells (e.g. 42, 43) to pulldown the dummy bitlines (e.g. 40, 41) is that the discharge ability of any given dummy cell can vary across a wide distribution just due to its location in the memory array 12, 14 or other factors. In some embodiments, this wide distribution may be due to the fact that devices having narrow channel widths are usually used in the actual and dummy cells. It is thus desirable to use other pulldown circuitry (e.g. in timing control 20) to pulldown the dummy bitlines (e.g. 40, 41) because the discharge ability of this other pulldown circuitry is not subject to the wide variability of the dummy cells. One reason for this increased stability of the other pulldown circuit is due to the fact that the other pulldown circuit is able to use wider and/or longer channel devices. In addition, since the other pulldown devices are not limited by the cell and array architecture and device dimensions, it is possible to optimize the device sizes in the other pulldown circuitry.

In addition, another problem with using the dummy cells (e.g. 42, 43) to pulldown the dummy bitlines (e.g. 40, 41) is that such designs would be limited to using an integer number of dummy cells (e.g. 42, 43) in order to increase or decrease the discharge ability for the dummy bitlines (e.g. 40, 41). Thus, using the dummy cells (e.g. 42, 43) to pulldown the dummy bitlines (e.g. 40, 41) results in less flexibility for controlling the discharge timing of the dummy bitlines (e.g. 40, 41). It is thus desirable to use other pulldown circuitry (e.g. in timing control 20) to more closely control the discharge timing of the dummy bitlines (e.g. 40, 41).

In one embodiment, the discharge timing of dummy bitlines (e.g. 40, 41) is then used to control the assertion of the sense trigger signal 44. The sense trigger signal 44 is then used to enable the sense amplifiers 28, 29. Memory block 10 is then read in a standard manner once sense amplifiers 28, 29 are enabled.

Figure 2:
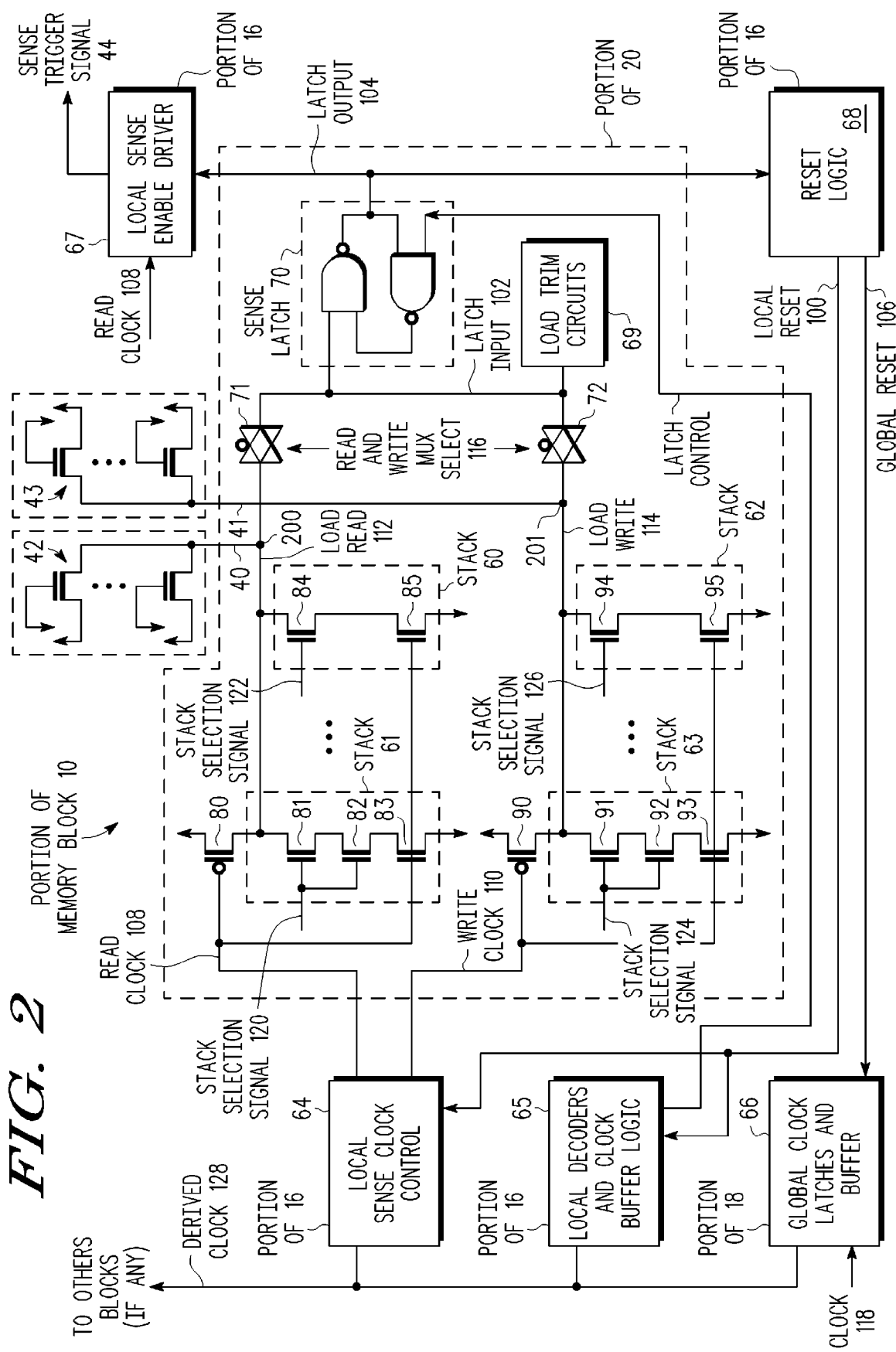
FIG. 2 illustrates, in partial block diagram form and partial schematic diagram form, a portion of memory block 10 of FIG. 1 in accordance with one embodiment of the present invention.

FIG. 2 illustrates a portion of memory block 10 of FIG. 1. One or more dummy cells (e.g. 42) is coupled to one or more dummy bitlines (e.g. 40) to replicate cell loading on an actual bitline in memory array 12, 14. One or more of a plurality of stacks (e.g. 60, 61) may be used for discharging the dummy bitlines (e.g. 40). In the illustrated embodiment, separate circuitry is used for reads (42, 40, 60, 61, 71, 80) and separate circuitry is used for writes (43, 41, 62, 63, 72, 90). Alternate embodiments may use the same circuitry for both reads and writes, or read only. Muxes 71 and 72 are used to select whether the read circuitry or the write circuitry is coupled to sense latch 70. As used herein the term "stack" means one or more, and the term "stack of pulldown transistors" means one or more pulldown transistors. Some embodiments may implement the stacks with only one transistor with varying transistor width or channel length to achieve a similar result as stacks having a plurality of transistors in each stack.

For read accesses or read cycles, the read clock 108 is used to enable discharging by the one or more selected pulldown stacks 60, 61. The stack selection signal 120 is used to select stack 61 and the stack selection signal 122 is used to select stack 60. For write accesses or write cycles, the write clock 110 is used to enable discharging by the one or more selected pulldown stacks 62, 63. The stack selection signal 124 is used to select stack 63 and the stack selection signal 126 is used to select stack 62. Other stack selection signals (not shown) may be added to select other potentially available stacks (not shown). Some embodiments may assert only one stack selection signal during a particular access cycle, while other embodiments may allow assertion of a plurality of stack selection signals during one access cycle.

Note that in an alternate embodiment, a second dummy bitline and a second plurality of dummy cells (not shown) may also be coupled to the read pulldown stack circuitry 60, 61. Note that in an alternate embodiment, a second dummy bitline and a second plurality of dummy cells (not shown) may also be coupled to the write pulldown stack circuitry 62, 63. In alternate embodiments, any number of dummy bitlines may be used. The illustrated circuitry for reads uses a plurality of stacks 60, 61, where the discharge timing for dummy bitlines (e.g. 40) is selected using stack selection signals 120 and 122. The illustrated circuitry for writes uses a plurality of stacks 62, 63, where the discharge timing for dummy bitlines (e.g. 41) is selected using stack selection signals 124 and 126. Some embodiments may select only one stack at a time, whereas alternate embodiments may select a plurality of stacks at one time. The stack selection signals 120, 122, 124, and 126 may be used to optimize the discharge timing of dummy bitlines 40, 41 so that the enabling of sense amplifiers 28 and 29 can be optimally timed during normal read and write accesses to memory block 10 (see FIG. 1)

Sense latch 70 is set when either the read-related dummy bitline 40 is discharged, or when the write-related dummy bitline 41 is discharged. The latch output 104 is provided to local sense enable driver 67. Local sense enable driver 67 then provides a sense trigger signal 44 which is used to trigger sense amplifiers 28, 29. In some embodiments, one or more load trim circuits 69 may be used to add more loading to the dummy bitlines 40, 41 in order to replicate loading on the actual bitlines (e.g. 45) due to column multiplexers, sense amplifiers, etc. Alternate embodiments may not use load trim circuits 69.

The connectivity of FIG. 2 will now be described. FIG. 2 illustrates a portion of memory block 10 of FIG. 1. Timing circuit 20 comprises a plurality of pulldown stacks (e.g. 60, 61), any one or more of which may be selected and used for discharging the dummy bitlines (e.g. 40). Pulldown stack 61 comprises transistors 81-83. N-channel transistor 83 has a second current electrode coupled to a second power supply voltage, and has a control electrode coupled to a read clock signal 108. The first current electrode of transistor 83 is coupled to a second current electrode of an n-channel transistor 82. The control electrode of transistor 82 is coupled to a stack selection signal 120. The first current electrode of transistor 82 is coupled to a second current electrode of an n-channel transistor 81. The control electrode of transistor 81 is also coupled to the stack selection signal 120. The first current electrode of transistor 81 is coupled to a second current electrode of a p-channel transistor 80 and to node 200. The first current electrode of transistor 80 is coupled to a first power supply voltage, and the control electrode of transistor 80 is coupled to the read clock signal 108.

Continuing with the connectivity of FIG. 2, stack 60 comprises transistors 84 and 85. N-channel transistor 85 has a second current electrode coupled to the second power supply voltage, and has a control electrode coupled to a read clock signal 108. The first current electrode of transistor 85 is coupled to a second current electrode of an n-channel transistor 84. The control electrode of transistor 84 is coupled to a stack selection signal 122. The first current electrode of transistor 84 is coupled to the second current electrode of transistor 80 and to node 200. Dummy bitline 40 is also coupled to node 200. One or more dummy memory cells (e.g. 42) are coupled to dummy bitline 40. Although dummy memory cell 42 has been illustrated as having a single transistor, alternate embodiments may use any desired and appropriate circuitry for the dummy memory cells (e.g. 42). The signal at node 200 is labeled load read 112.

Local sense clock control circuitry 64 may be used to provide the stack selection signals 120, 122, 124, and 126. In the illustrated embodiment, separate circuitry is used for reads (42, 40, 60, 61, 71, 80) and separate circuitry is used for writes (43, 41, 62, 63, 72, 90). Alternate embodiments may use the same circuitry for both reads and writes, or read only. In the illustrated embodiments, multiplexers 71 and 72 may be used to select whether the read circuitry or the write circuitry is coupled to sense latch 70.

The connectivity of the pulldown stack circuitry used for writes will now be described. Timing circuit 20 comprises a plurality of pulldown stacks (e.g. 62, 63), any one or more of which may be selected and used for discharging the dummy bitlines (e.g. 41). Pulldown stack 63 comprises transistors 91-93. N-channel transistor 93 has a second current electrode coupled to the second power supply voltage, and has a control electrode coupled to a write clock signal 110. The first current electrode of transistor 93 is coupled to a second current electrode of an n-channel transistor 92. The control electrode of transistor 92 is coupled to a stack selection signal 124. The first current electrode of transistor 92 is coupled to a second current electrode of an n-channel transistor 91. The control electrode of transistor 91 is also coupled to the stack selection signal 124. The first current electrode of transistor 91 is coupled to a second current electrode of a p-channel transistor 90 and to node 201. The first current electrode of transistor 90 is coupled to the first power supply voltage, and the control electrode of transistor 90 is coupled to the write clock signal 110.

Continuing with the connectivity of FIG. 2, stack 62 comprises transistors 94 and 95. N-channel transistor 95 has a second current electrode coupled to the second power supply voltage, and has a control electrode coupled to the write clock signal 110. The first current electrode of transistor 95 is coupled to a second current electrode of an n-channel transistor 94. The control electrode of transistor 94 is coupled to a stack selection signal 126. The first current electrode of transistor 94 is coupled to the second current electrode of transistor 90 and to node 201. Dummy bitline 41 is also coupled to node 201. One or more dummy memory cells (e.g. 43) are coupled to dummy bitline 41. Although dummy memory cells 43 has been illustrated as having a single transistor, alternate embodiments may use any desired and appropriate circuitry for the dummy memory cells (e.g. 43). The signal at node 201 is labeled load write 114.

The load read signal 112 is provided as an input to multiplexer 71, and the load write signal 114 is provided as an input to multiplexer 72. The read and write mux select signal 116 allows only one of the load read signal 112 and the load write signal 114 through to the input of sense latch 70. Latch 70 is set when either the dummy bitline 40 is sufficiently discharged (load read 112 is provided to the input of latch 70) or when the dummy bitline 41 is sufficiently discharged (load write 114 is provided to the input of latch 70). Although the illustrated embodiment of sense circuitry 70 uses a latch, alternate embodiments may use any desired circuitry to detect when the dummy bitline(s) have been discharged. In the illustrated embodiment, when the sense circuitry 70 senses that the dummy bitline(s) have been sufficiently discharged, the sense circuitry 70 asserts an output signal (latch output 104) in one embodiment. Latch output signal 104 is provided to local sense enable driver circuitry 67, which asserts the sense trigger signal 44 in response. Alternate embodiments may not use local sense enable driver 67. In some embodiments, the output of sense circuitry 70 may also be provided to reset logic 68. In the illustrated embodiment, local decoders and clock buffer logic 65 provides an enable or clock input to sense circuitry 70. In alternate embodiments, sense circuitry 70 may be enabled or timed in a different manner.

In the illustrated embodiment, reset logic 68 receives the output of sense latch 70, and then provides a local reset signal 100 to the portions of local control circuitry 16 that are desired to be reset. For example, local reset signal 100 is provided to local decoders and clock buffer logic 65 and to local sense clock control circuitry 64. For reads, local sense clock control circuitry 64 then changes the state of read clock 108 so that the selected stacks 60, 61 are precharged. For writes, local sense clock control circuitry 64 then changes the state of write clock 110 so that the selected stacks 62, 63 are precharged. Reset logic 68 receives the output of sense latch 70, and then also provides a global reset signal 106 to the portions of global control circuitry 18 (e.g. global clock latches and buffer 66) that are desired to be reset. In the illustrated embodiment, the local reset signal 100 also negates other signals as well as terminating the read or write operation or access to memory block 10. For example, in one embodiment, the local reset signal 100 resets the local control circuitry (e.g. 16 of FIG. 1) and also the sense latch 70 (see FIG. 2). Alternate embodiments may not use reset logic 68 or may use a different circuit and method to initiate the precharging of the desired stacks 60-63.

A clock 118 is provided to global clock latches and buffer circuitry 66. Global clock latches and buffer circuitry 66 then uses this clock to produce a derived clock 128 in the illustrated embodiment, this derived clock 128 is used to clock circuits 64, 65 and is also provided to other blocks (not shown) that may also be manufactured on the same integrated circuit. In the illustrated embodiment, circuitry 66 is the input clock latch for which the derived clock 128 is an output.

Although circuits 64, 65, 67 and 68 have been illustrated as being part of local control circuitry 16 (see FIG. 1), alternate embodiments may implement and/or locate this functionality in a wide variety of different ways. Likewise, although circuit 66 has been illustrated as being part of global control circuitry 18 (see FIG. 1), alternate embodiments may implement and/or locate this functionality in a different manner.

Figure 3:
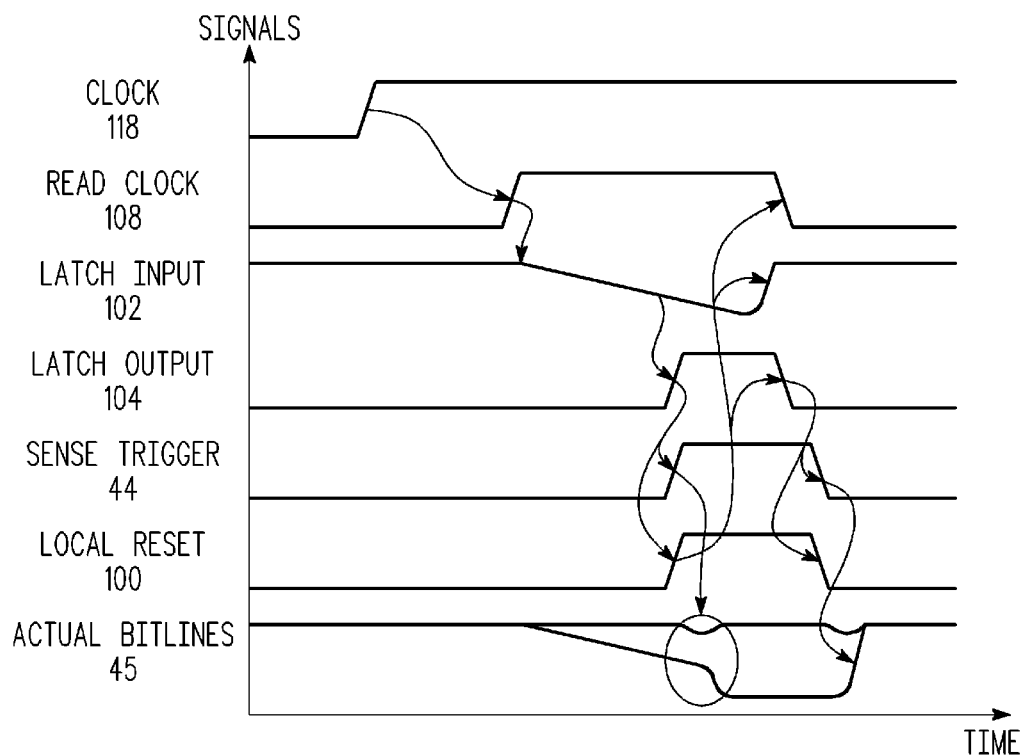
FIG. 3 illustrates, in timing diagram form, timing for a plurality of signals of memory block 10 of FIGS. 1 and 2 during a read cycle.

FIG. 3 illustrates a read timing diagram for one embodiment of the memory block 10 illustrated in FIGS. 1 and 2. Note that read clock signal 108 enables the selected pulldown stack (e.g. 60, 61). The discharge of the dummy bitline 40, shown as Latch Input 102, causes latch 70 to set (signal Latch Output 104). The assertion of latch output 104 asserts sense trigger signal 44 and asserts local reset 100. The assertion of sense trigger signal 44 causes sense amplifiers 28 and 29 to be enabled. As a result, sense amplifiers 28 and 29 are enabled to read the actual bitlines (e.g. 45) in memory arrays 12 and 14. Note that the assertion of local reset 100 will cause negation of read clock 108, thus terminating the read access. As a result, the selected pulldown stack(s) (e.g. 60, 61) will be precharged for the next read access and sense latch 70 will be reset.

Figure 4:
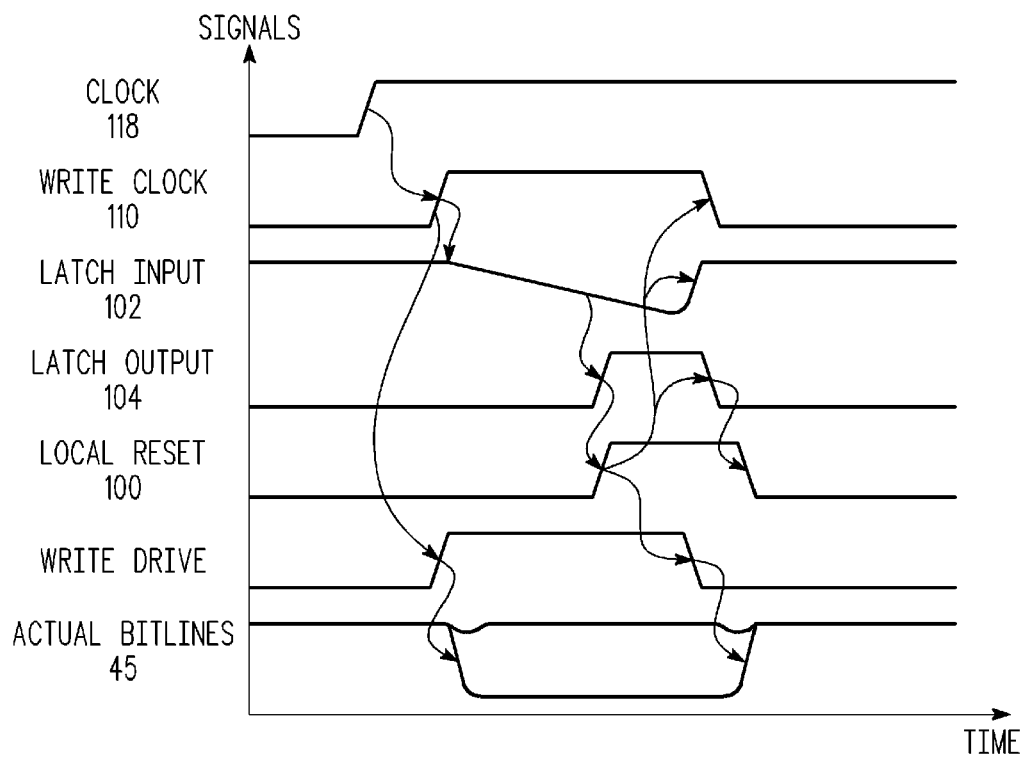
FIG. 4 illustrates, in timing diagram form, timing for a plurality of signals of memory block 10 of FIGS. 1 and 2 during a write cycle.

FIG. 4 illustrates a write timing diagram for one embodiment of the memory block 10 illustrated in FIGS. 1 and 2. Note that write clock signal 110 enables the selected pulldown stack (e.g. 62, 63) and asserts a write drive signal to enable the write drivers 26, 27. The discharge of the dummy bitline 41, shown as Latch Input 102, causes latch 70 to set (signal Latch Output 104). The assertion of latch output 104 asserts local reset 100. Note that the assertion of local reset 100 will cause negation of write clock 110 and write drive, thus terminating the write access. As a result, the selected pulldown stack(s) (e.g. 62, 63) will be precharged for the next write access and sense latch 70 will be reset. Note that for the illustrated embodiment, circuitry within the local sense enable driver 67 will prevent the sense trigger signal 44 from asserting during a write access. In the illustrated embodiment, sense amps 29 (see FIG. 1) will not fire during writes to memory block 10. In one embodiment, the circuitry uses a signal such as read clock 108 (see FIG. 2) as in input to the local sense enable driver 67 so that only reads will activate local sense enable driver 67.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Some of the above embodiments, as applicable, may be implemented using a variety of different information processing systems. For example, although FIG. 1 and the discussion thereof describe an exemplary memory architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of memory 10 are circuitry located on a single integrated circuit or within a same device. Alternatively, memory 10 may include any number of separate integrated circuits or separate devices interconnected with each other. Also for example, memory 10 or portions thereof may be soft or code representations of physical circuitry or of logical representations convertible into physical circuitry. As such, memory 10 may be embodied in a hardware description language of any appropriate type.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Memory 10 may be embodied in a hardware description language of any appropriate type that may be retrievable from computer readable media or other media on other computer systems. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

Additional Text

1. A memory having at least one memory array block, the at least one memory array block comprising N wordlines, wherein N is greater than one, the memory comprising:
  a plurality of sense amplifiers coupled to the at least one memory array block;
  at least one dummy bitline, wherein the at least one dummy bitline comprises M dummy bitcells, wherein M is equal to N; and
  a timing circuit coupled to the at least one dummy bitline, wherein the timing circuit comprises at least one stack of pulldown transistors coupled to a sense circuit for generating a sense trigger signal used to enable the plurality of sense amplifiers.

2. The memory of item 1, wherein the at least one memory array block comprises a first memory array and a second memory array and wherein the at least one dummy bitline is located adjacent to at least one of the first memory array and the second memory array.

3. The memory of item 2, wherein the at least one dummy bitline is located nearest to a plurality of wordline drivers coupled to the at least one memory array block.

4. The memory of item 1, further comprising a local control circuit for generating a clock signal for triggering the timing circuit and at least one of the N wordlines.

5. The memory of item 1, wherein the sense trigger signal is generated based on at least a load characteristic of the at least one dummy bitline.

6. The memory of item 1, wherein the timing circuit further comprises a plurality of stacks of pulldown transistors, wherein the at least one stack of pulldown transistors is selected from the plurality of stacks of pulldown transistors in response to a stack selection signal.

7. The memory of item 6, wherein pulldown transistors within a specific stack of pulldown transistors have the same size.

8. The method of item 7, wherein the pulldown transistors vary in size from one stack of pulldown transistors to another stack of pulldown transistors.

9. The memory of item 1 further comprising a plurality of dummy bitlines, wherein the timing circuit is coupled to the plurality of dummy bitlines and wherein each of the plurality of bitlines comprises M dummy bitcells, wherein M is equal to N.

10. A memory having at least one memory array block, the at least one memory array block comprising N wordlines, wherein N is greater than one, the memory comprising:
  a plurality of sense amplifiers coupled to the at least one memory array block;
  at least one dummy bitline, wherein the at least one dummy bitline comprises M dummy bitcells, wherein M is equal to N; and
  a timing circuit coupled to the at least one dummy bitline forming a node, wherein the timing circuit comprises at least one stack of pulldown transistors coupled to a sense circuit for generating a local reset signal used to precharge the node, wherein the local reset signal is generated based on at least a load characteristic of the at least one dummy bitline.

11. The memory of item 10, wherein the at least one memory array block comprises a first memory array and a second memory array and wherein the at least one dummy bitline is located adjacent to at least one of the first memory array and the second memory array.

12. The memory of item 11, wherein the at least one dummy bitline is located nearest to a plurality of wordline drivers coupled to the at least one memory array block.

13. The memory of item 10, further comprising a local control circuit for generating a clock signal for triggering the timing circuit and at least one of the N wordlines.

14. The memory of item 10, wherein the timing circuit further comprises a plurality of stacks of pulldown transistors, wherein the at least one stack of pulldown transistors is selected from the plurality of stacks of pulldown transistors in response to a stack selection signal.

15. The memory of item 14, wherein pulldown transistors within a specific stack of pulldown transistors have the same size.

16. The memory of item 15, wherein the pulldown transistors vary in size from one stack of pulldown transistors to another stack of pulldown transistors.

17. A method for operating a memory comprising at least one memory array block, the at least one memory array block comprising N wordlines, wherein N is greater than one, the memory further comprising a plurality of sense amplifiers coupled to the at least one memory array block, at least one dummy bitline, wherein the at least one dummy bitline comprises M dummy bitcells, wherein M is equal to N, and a timing circuit, the method comprising:
  receiving a read or write operation signal; and
  using the timing circuit, generating a sense trigger signal used to enable the plurality of sense amplifiers, wherein a timing of generation of the sense trigger signal is a function of at least a capacitive load associated with the at least one dummy bitline.

18. The method of item 17, wherein a change in the at least the capacitive load of the at least one dummy bitline tracks a change in a size of the memory.

19. The method of item 17, wherein the timing circuit comprises a plurality of stacks of pulldown transistors and the method further comprising:
  selecting one of the plurality of stacks of pulldown transistors in response to a receipt of a stack selection signal.

20. The method of item 17, wherein a coupling of the timing circuit and the at least one dummy bitline forms a node, the method further comprising:
generating a local reset signal used to precharge the node.

21. The method of item 20, wherein the memory further comprises a sense latch, the method further comprising:
using the local reset signal:
to reset control logic associated with the memory;
to terminate the read or write operation; and
to reset the sense latch.

What is claimed is:

1. A memory having at least one memory array block, the at least one memory array block comprising N wordlines, wherein N is greater than one, the memory comprising:
a plurality of sense amplifiers coupled to the at least one memory array block;
at least one bit line comprising bitcells, wherein the N wordlines are used to select the bitcells;
at least one dummy bitline, wherein the at least one dummy bitline comprises M dummy bitcells, wherein M is equal to N; and
a timing circuit coupled to the at least one dummy bitline, wherein the timing circuit comprises at least one stack of pulldown transistors coupled to a sense circuit for generating a sense trigger signal used to enable the plurality of sense amplifiers, wherein each of the M dummy bitcells of the at least one dummy bitline includes pass gates that are negated such that none of the M dummy bitcells is selected using a dummy wordline.

2. The memory of claim 1, wherein the at least one memory array block comprises a first memory array and a second memory array and wherein the at least one dummy bitline is located adjacent to at least one of the first memory array and the second memory array.

3. The memory of claim 1 further comprising a local control circuit for generating a clock signal for triggering the timing circuit and at least one of the N wordlines.

4. The memory of claim 1, wherein the sense trigger signal is generated based on at least a load characteristic of the at least one dummy bitline.

5. The memory of claim 1, wherein the timing circuit further comprises a plurality of stacks of pulldown transistors, wherein the at least one stack of pulldown transistors is selected from the plurality of stacks of pulldown transistors in response to a stack selection signal.

6. The memory of claim 5, wherein pulldown transistors within a specific stack of pulldown transistors have same size.

7. The method of claim 6, wherein the pulldown transistors vary in size from one stack of pulldown transistors to another stack of pulldown transistors.

8. The memory of claim 1 further comprising a plurality of dummy bitlines, wherein the timing circuit is coupled to the plurality of dummy bitlines and wherein each of the plurality of bitlines comprises M dummy bitcells, wherein M is equal to N.

9. A memory having at least one memory array block, the at least one memory array block comprising N wordlines, wherein N is greater than one, the memory comprising:
a plurality of sense amplifiers coupled to the at least one memory array block;
at least one bit line comprising bitcells, wherein the N wordlines are used to select the bitcells;
at least one dummy bitline, wherein the at least one dummy bitline comprises M dummy bitcells, wherein M is equal to N; and
a timing circuit coupled to the at least one dummy bitline forming a node, wherein the timing circuit comprises at least one stack of pulldown transistors coupled to a sense circuit for generating a local reset signal used to precharge the node, wherein the local reset signal is generated based on at least a load characteristic of the at least one dummy bitline,
wherein each of the M dummy bitcells of the at least one dummy bitline includes pass gates that are negated such that none of the M dummy bitcells is selected using a dummy wordline.

10. The memory of claim 9, wherein the at least one memory array block comprises a first memory array and a second memory array and wherein the at least one dummy bitline is located adjacent to at least one of the first memory array and the second memory array.

11. The memory of claim 10, wherein the at least one dummy bitline is located nearest to a plurality of wordline drivers coupled to the at least one memory array block.

12. The memory of claim 9 further comprising a local control circuit for generating a clock signal for triggering the timing circuit and at least one of the N wordlines.

13. The memory of claim 9, wherein the timing circuit further comprises a plurality of stacks of pulldown transistors, wherein the at least one stack of pulldown transistors is selected from the plurality of stacks of pulldown transistors in response to a stack selection signal.

14. The memory of claim 13, wherein pulldown transistors within a specific stack of pulldown transistors have same size.

15. The memory of claim 14, wherein the pulldown transistors vary in size from one stack of pulldown transistors to another stack of pulldown transistors.

16. A method for operating a memory comprising at least one memory array block, the at least one memory array block comprising N wordlines, wherein N is greater than one, the memory further comprising a plurality of sense amplifiers coupled to the at least one memory array block, at least one bit line comprising bitcells, wherein the N wordlines are used to select the bitcells, at least one dummy bitline, wherein the at least one dummy bitline comprises M dummy bitcells, wherein M is equal to N, and a timing circuit, the method comprising:
receiving a read or write operation signal;
using the timing circuit, generating a sense trigger signal used to enable the plurality of sense amplifiers, wherein a timing of generation of the sense trigger signal is a function of at least a capacitive load associated with the at least one dummy bitline, and wherein the timing of generation of the sense trigger signal is independent of a capacitive load associated with a dummy wordline, and wherein each of the M dummy bitcells of the at least one dummy bitline includes pass gates that are negated such that none of the M dummy bitcells is selected using the dummy wordline.

17. The method of claim 16, wherein a change in the at least the capacitive load of the at least one dummy bitline tracks a change in a size of the memory.

18. The method of claim 16, wherein the timing circuit comprises a plurality of stacks of pulldown transistors and the method further comprising:
selecting one of the plurality of stacks of pulldown transistors in response to a receipt of a stack selection signal.

19. The method of claim 16, wherein a coupling of the timing circuit and the at least one dummy bitline forms a node, the method further comprising:
generating a local reset signal used to precharge the node.

20. The method of claim 19, wherein the memory further comprises a sense latch, the method further comprising:
using the local reset signal:
to reset control logic associated with the memory;
to terminate the read or write operation; and
to reset the sense latch.

* * * * *